Figure 1:
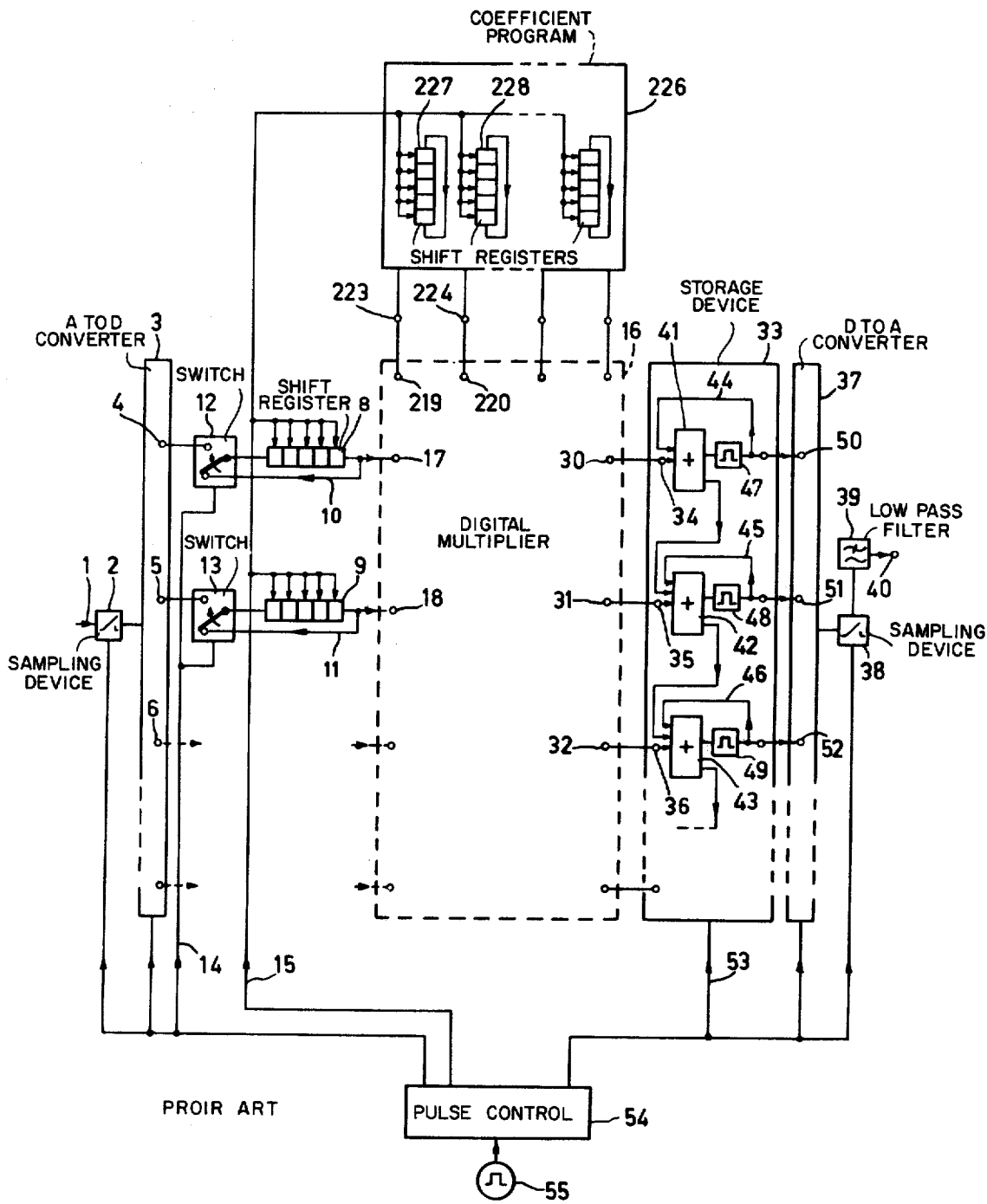

United States Patent [19]
van Gerwen et al.

[11] 3,965,338

[45] June 22, 1976

[54] APPARATUS FOR ACHIEVING A PREDETERMINED TRANSFER CHARACTERISTIC

[75] Inventors: Petrus Josephus van Gerwen; Hendrik Arie van Essen; Wilfred Andre Maria Snijders, all of Eindhoven, Netherlands

[73] Assignee: U.S. Philips Corporation, New York, N.Y.

[22] Filed: Sept. 2, 1975

[21] Appl. No.: 609,446

Related U.S. Application Data

[63] Continuation of Ser. No. 474,810, May 30, 1974.

[30] Foreign Application Priority Data

June 13, 1973 Netherlands.................. 7308175

[52] U.S. Cl. ........................ 235/150.52; 235/156; 328/167
[51] Int. Cl.² .................................... G06J 1/00
[58] Field of Search....... 235/150.52, 150.5, 150.51, 235/150.53, 152, 156; 340/347 AD; 328/165–167; 333/18, 28, 70 T

[56] References Cited

UNITED STATES PATENTS

| | | | |
|---|---|---|---|
| 3,314,015 | 4/1967 | Simone................................. | 328/165 |
| 3,521,170 | 7/1970 | Leuthold et al............... | 340/347 AD |
| 3,617,719 | 11/1971 | Wong et al. ...................... | 235/152 |
| 3,634,659 | 1/1972 | Lucas et al. .................. | 235/150.52 |
| 3,789,199 | 1/1974 | Kotwicki......................... | 235/150.5 |

*Primary Examiner*—Joseph F. Ruggiero
*Attorney, Agent, or Firm*—Frank R. Trifari; Daniel R. McGlynn

[57] ABSTRACT

A pulse switched digital multiplier for matching transfer characteristics of digital processes having a plurality of pulse switch positions, and a pulse switch setting circuit which, under the control of a setting code from a setting program, sets the pulse switch to a given one of the pulse switch positions. Each switch position corresponds to a discrete digital multiplication performed by one of a plurality of discrete multiplication coefficients forming part of the discrete number set $2^m$, (where $m = 0, 1, 2, \ldots,$) and possibly the number 0. A storage device in the form of an integrater is also provided.

19 Claims, 9 Drawing Figures

APPARATUS FOR ACHIEVING A PREDETERMINED TRANSFER CHARACTERISTIC

This is a continuation of application Ser. No. 474,810, filed May 30, 1974.

The invention relates to an apparatus for achieving a predetermined transfer characteristic of information signals, said apparatus at least including a delay device comprising a plurality of delay elements and an input circuit to which information pulses derived from the information signals are applied in accordance with the clock frequency, a control generator which is connected to the delay device and which operates at a control frequency equal to an integral multiple of the clock frequency, and a digital multiplier which is coupled to the delay device which by the appearance of a pulse at its input circuit in successive periods of time produces a train of pulses for the digital multiplier, the pulses derived from the delay device being digitally multiplied in the digital multiplier by digital multiplication coefficients in a binary number system whilst multiplication products which appear at the output of the digital multiplier are summed in a circuit provided with a storage device. Suitable delay devices are shift registers, random access stores and the like.

Such apparatus is used in particular for purposes of equalising, filtering, wide-band phase shifting and the like of pulse signals but also of analogue signals as speech signals in that these signals, after being converted to pulse signals in an analog-to-digital converter, are applied to the input of the apparatus, the pulse code groups obtained at the output being used for further digital processing or being restored to analog shape by means of a digital-to-analog converter.

For practical use apparatus of the abovedescribed type using digital techniques have important advantages which include reproducibility of the desired transfer characteristic with substantial independence from tolerances, temperature influences, aging phenomena and the like, and they are particularly suitable for integration in a semiconductor body by the use of MOS or bipolar techniques. It was found that in special cases, such as the realisation of bandpass filter characteristics having steep edges, in such apparatus owing to the required increase in size of the pulse groups which represent the multiplication coefficients the difficulties experienced in impementing the digital multiplier grow progressively, in particular in respect of structural complexity and decrease of the internal processing time available for performing the various digital operations.

It is an object of the present invention to provide a new concept of an apparatus for the abovedescribed type in which by matching of the shape of the transfer characteristic to be achieved and of the problems of digital processing the difficulties of implementing the digital multiplier are considerably simplified and at the same time the field of application is extended.

The apparatus according to the invention is characterized in that the digital multiplier is in the form of a pulse switch having a plurality of pulse switch positions for discrete multiplication of the pulses derived from the delay device by discrete multiplication coefficients which in a differential code characterize the transfer characteristic to be achieved, which digital multiplier in the form of a pulse switch is also provided with a pulse switch setting circuit which is controlled by a setting code originating from a setting program for setting the pulse switch to a given position of the various positions in each of which the discrete digital multiplication by one of the said plurality of multiplication coefficients in a differential code which exclusively form part of the discrete set of numbers $2^m$, where $m = 0, 1, 2 \ldots$, and possibly the number 0, is performed, whilst in the circuit which includes the storage device the applied multiplication products are continuously summed with the multiplication products of previous periods.

Figure 2:
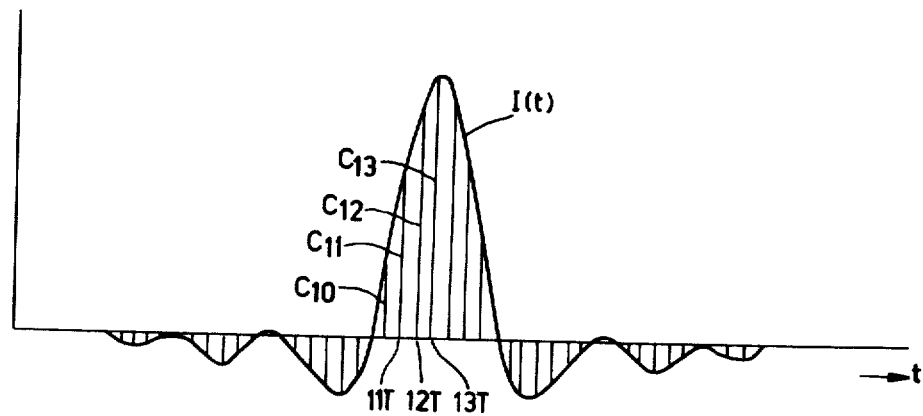
Figure 2:
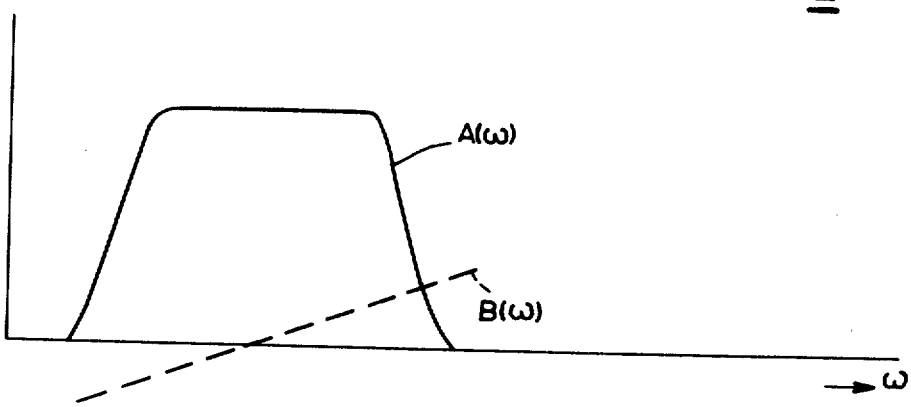
Figure 2:
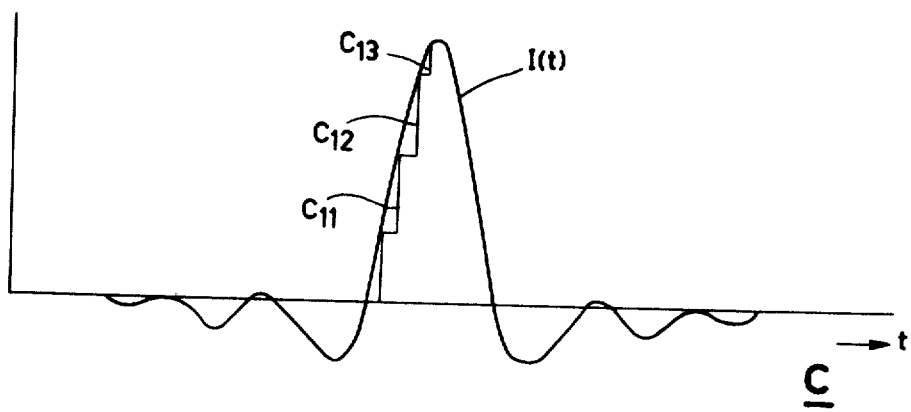
Figure 3:
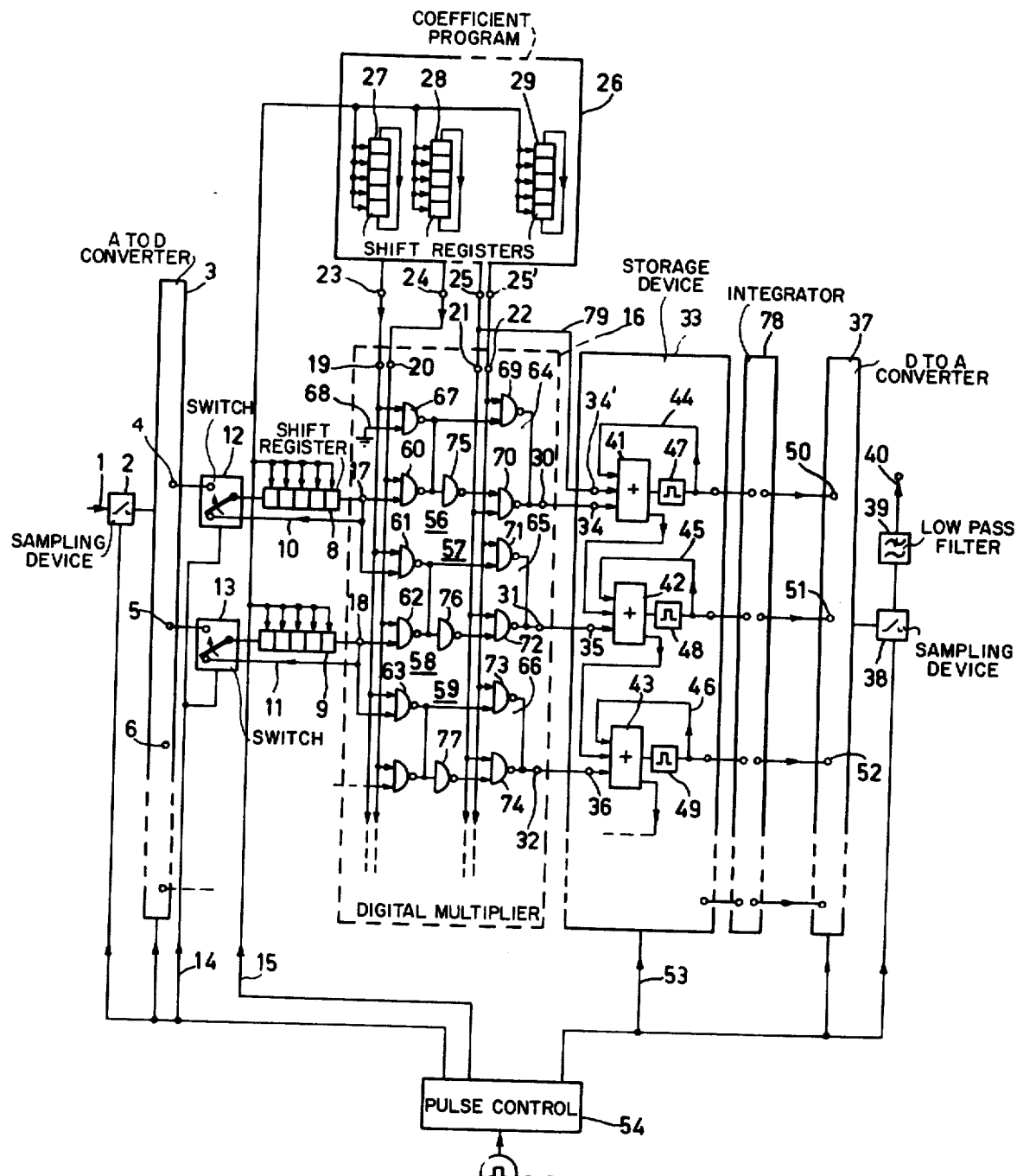
Figure 4:
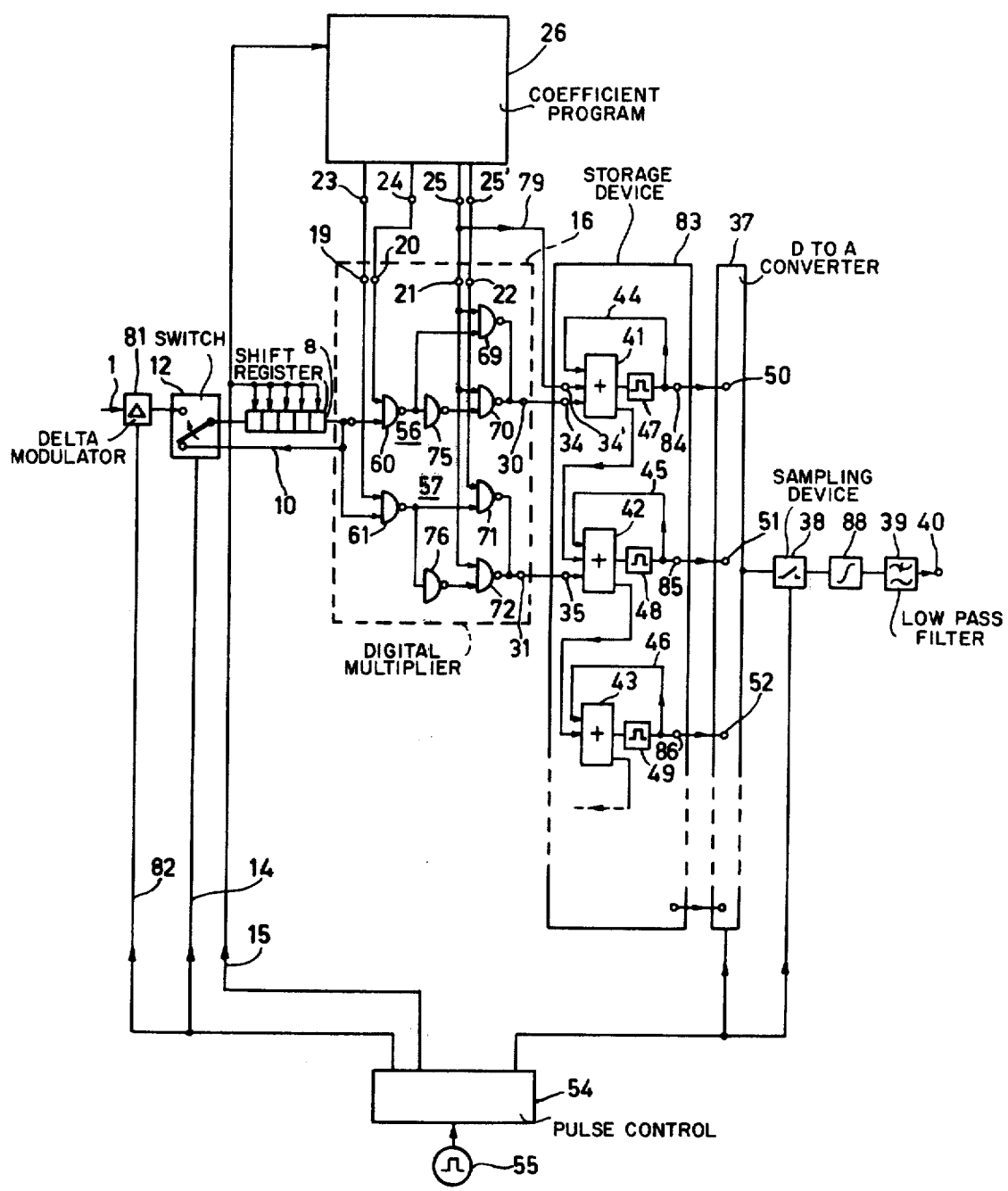
Figure 5:
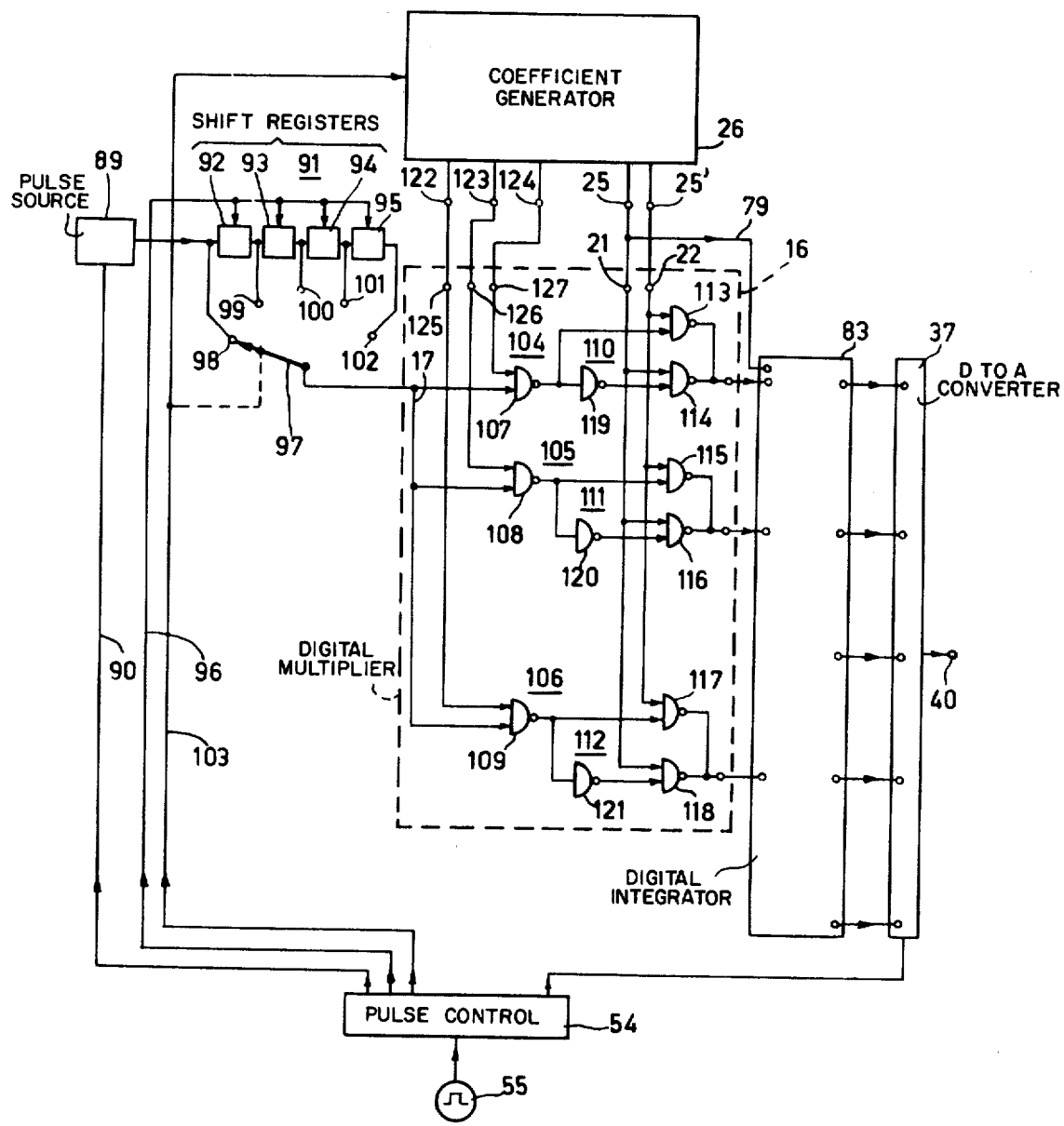
Figure 6:
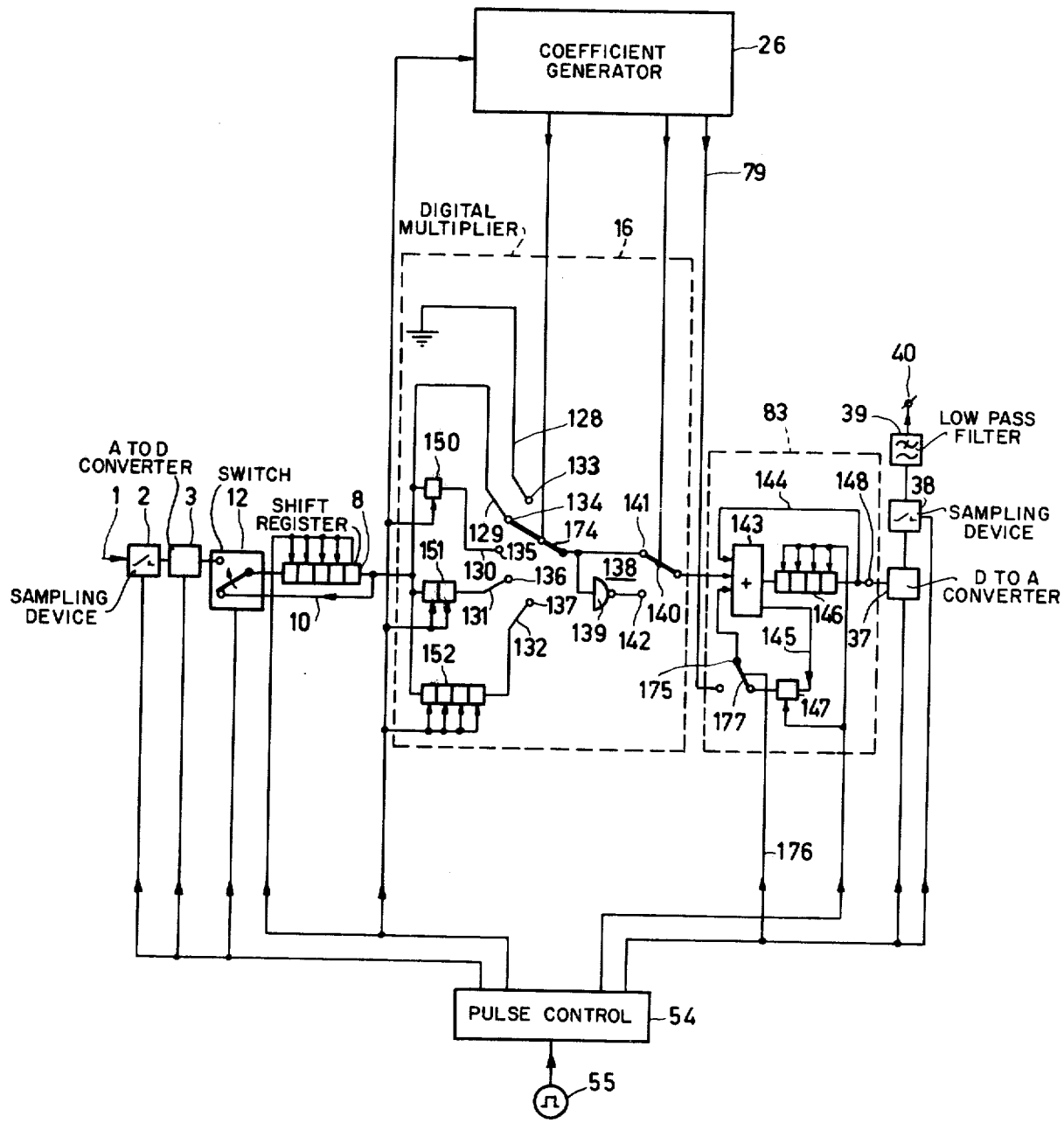
Figure 7:
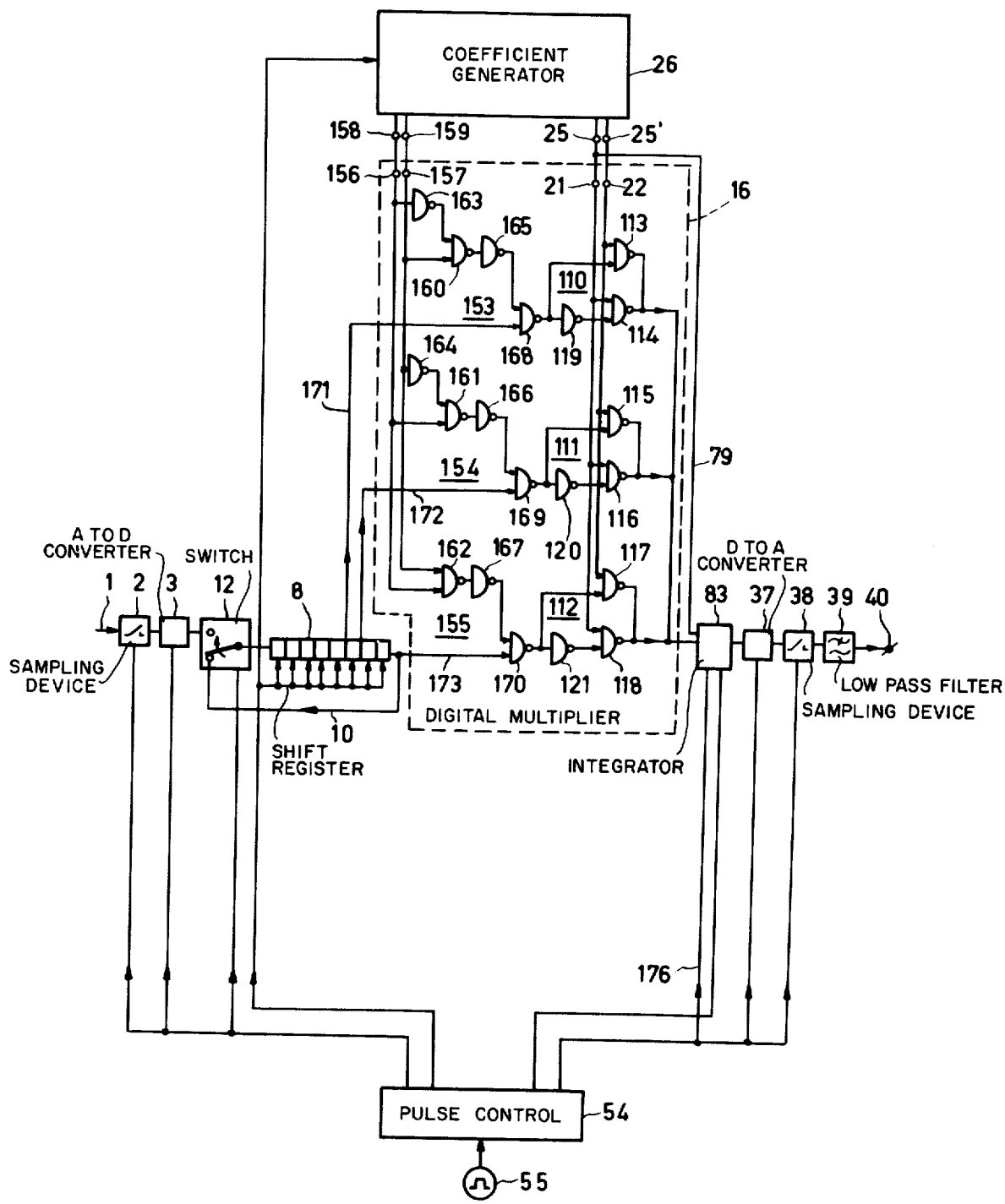

Embodiments of the invention will now be described, by way of example, with reference to the accompanying diagrammatic drawings, in which:

FIG. 1 shows a known apparatus adapted for use as a filter for analog signals,

FIGS. 2a and 2b being a time diagram and a frequency diagram respectively illustrating the operation of the apparatus, FIG. 3 shows an apparatus according to the invention, FIG. 2c being a time diagram illustrating the operation of the apparatus of FIG. 3, FIGS. 4 and 5 show further embodiments of the apparatus shown in FIG. 3, and FIGS. 6 and 7 show modifications of the apparatus according to the invention.

Referring now to FIG. 1, there is shown a known apparatus arranged for use as a band-pass filter for analog signals, for example in the band between 300 and 3400 Hz and in which in order to permit the filtering process to be carried out digitally the received analog signals are first converted to a digital form. For this purpose in the embodiment shown the analog signals received from a line 1 are sampled in a sampling device 2 by means of sampling pulses at a clock frequency F and then applied to an analog-to-digital converter 3 which comprises a parallel-output pulse group coder the output terminals of which are designated by 4, 5, 6 . . . . . respectively. The clock frequency F is equal to 1/T, where T is a clock period.

Each time the sampling device 2 performs a sampling operation at a clock instant the output terminals 4, 5, 6, . . . . . of the pulse group coder 3 deliver a pulse group in parallel form which is characterized by binary pulses representing the values 1 and 0 and which in the binary number system indicates the quantized amplitude value of the sampling. More particularly the pulses at the output terminal 4 characterize the amplitude value $2^0$, these at the output terminal 5 the amplitude value $2^1$, those at the output terminal 6 the amplitude value $2^2$, and so on.

Thus when at an arbitrary clock instant given by an arbitrary integral multiple $\nu$ of the clock period T a pulse group $U_\nu$ occurs and the binary pulses which simultaneously appear at the output terminals 4, 5, 6, . . . are denoted by $u_{\nu\ 0}, u_{\nu\ 1}, \ldots \ldots u_{\nu\ i} \ldots \ldots u_{\nu\ (k-1)}$, where $k$ is the number of output terminals 4, 5, 6 . . . of the pulse group coder 3, the said pulse group $U_\nu$ represents the numerical value $$\sum_{i=0}^{i=k-1} 2^i u_{\nu\ i}$$

In order to perform the digital filtering process the output terminals 4, 5, 6 . . . of the pulse group coder 3 are connected to delay devices in the form of shift registers 8, 9 . . . . which each comprise a plurality of shift registers elements, an input circuit and an output circuit and are designed as circulating shift registers by feedback circuits 10, 11, ..... each connected between an input circuit and the associated output circuit. In the Figure, only the first two shift registers 8 and 9 are shown in detail, because the remaining shift registers are equal thereto.

Each of the inpput circuits of the shift registers 8, 9 . . . . comprises a switch 12 and 13 respectively which normally is connected to the feedback circuit 10 and 11 respectively and by a switching pulse applied via a line 14 by a switching pulse generator at each clock instant is connected to the relevant one of the output terminals 4, 5, 6 . . . . of the pulse group coder 3, whilst by means of shift pulses applied via a line 15 by a common control generator in the form of a shift pulse generator the contents of all the shift registers 8, 9 . . . . are shifted at a shift frequency equal to an integral multiple $n$ of the clock frequency $F = 1/T$.

As will be set out more fully hereinafter, for the purpose of carrying out the digital filtering process care has been taken to ensure that each of the pulses of a pulse code group which at the clock instant are inserted into the first shift register element of the relevant shift register 8, 9 . . . . . causes a train of output pulses to be produced at the shift register output circuit during successive periods, and in the embodiment shown this is achieved in that at the shift frequency of nF Hz used the number of shift register elements of each of the shift registers 8, 9 . . . . is made equal to $(n-1)$..

For the purpose of carrying out the digital filtering process the apparatus shown includes a digital multiplier 16 having a parallel input comprising $k$ input terminals 17, 18, . . . . . . which each are connected to an output circuit of one of the $k$ shift registers 8, 9 . . . and a parallel input comprising $p$ input terminals 219, 220, . . . . which each are connected to one of the output terminals 223, 224, . . .respectively of the parallel output of a coefficient program 226 which indicates the multiplication coefficients by pulse groups and in the embodiment shown is formed in known manner by circulating shift registers 227, 228, . . . . . .

Similarly to the contents of the shift registers 8, 9, . . . .the contents of the circulating shift registers 227, 228, . . . . . of the coefficient program 226 are shifted by pulses applied via the line 15 at the shift frequency nF, however, they each contain $n$ shift register elements in which the pulses of the pulse groups of the coefficient program 226 have been written which comprise $(p-1)$ pulses having numerical values $2^0$, $2^1$, . . . . . $2^{p-2}$ and one sign pulse, which pulses are simultaneously derived from the parallel output comprising output terminals 224, 223, . . . In particular, if at an arbitrary clock instant $\nu T$ there appears at the output terminals 223, 224, . . . . a pulse group $C_n$ which comprises pulses $c_{n,0}$, $c_{n,1}$, . . . .$c_{n,s}$ . . . .$c_{n,p-2}$ and a sign pulse which characterises the sign $\overline{c_n}$, and if at the next shift instant $\nu T + T/n$ a pulse group denoted by $C_{n,1}$ comprises pulses $C_{n-1,0}$, $c_{n-1,1}$ . . . .$c_{n-1,s}$. . . . . $n_-1,p_-2$ having the sign $c_{n-1}$ characterized by the sign pulse, then for an arbitrary shift instant $\nu T + (n_-q)T/n$ within the clock period the pulse group $C_q$ appearing at this instant can be represented by pulses $c_{q,0}$, $c_{q,1}$ . . . .$c_{q,s}$ . . . .$c_{q,p-2}$ and by the sign $\overline{c_q}$ characterized by the sign pulse, which pulse group $C_q$ in sign and magnitude represents the number:

$$\overline{c_q} \sum_{s=0}^{s=p-2} 2^s c_{q,s}$$

After $n$ shift periods $T/n$ the next clock instant $(\nu+1)T$ is reached and again the pulse group designated $C_n$ is derived from the output terminals 223, 224, . . . . .of the coefficient program 226, after which the described cycle is repeated.

Whenever at a shift instant a pulse group of $k$ pulses from the shift registers 8, 9 . . . and a pulse group of $p$ pulses from the coefficient program 226 appear simultaneously at the input terminals 17, 18, . . . .and 219, 220, . . . respectively, the two pulse groups are digitally multiplied by one another in the digital multiplier 16 which has a parallel output comprising at most $(k + p)$ output terminals 30, 31, 32, . . . the resulting product in the form of a pulse group being applied for further processing to a storage device 33 having a parallel input comprising input terminals 34, 35, 36, . . . In the embodiment shown the storage device 33 is in the form of a digital accumulator.

During each clock period the output pulse groups from the digital multiplier 16 which appear in this period are digitally summed and then applied to a digital-to-analog converter 37 which has a parallel input and the output of which is connected via a sampling device 38 controlled by sampling pulses at clock frequency to the output terminal 40 of the apparatus, if required via a simple low-pass filter 39 which rejects undesirable pass-bands.

The accumulator used is of a known type and, as is schematically shown in the Figure, comprises a plurality of parallel digital summing devices 41, 42, 43, which each have a feedback circuit 44, 45, 46 including a bistable trigger 47, 48, 49 respectively connected between an input terminal 50, 51, 52 respectively of the parallel input of the digital-to-analog converter 37 and the input of the relevant digital summing device 41, 42, 43 respectively, an output of each of the digital summing devices 41, 42, 43 being connected to the next subsequent summing device 42, 43, . . . for the carry pulses which are produced in the digital summations.

When during a clock period the multiplication products which are produced during this period and are in the form of pulse groups have been summed in the digital accumulator 33, the accumulator 33 is restored in the rest condition by means of reset pulses applied to all bistable triggers 47, 48, 49 via a common line 53, after which the abovedescribed cycle will be repeated in the next clock period. Both the reset pulses and all the other control pulses for the apparatus described, in particular the sampling pulses for the sampling devices 2 and 38 and the control pulses for the analog-to-digital converter 3 and the digital-to-analog converter 37, are derived from a central control pulse device 54 which is connected to a pulse generator 55 and also includes the common shift pulse generator for the shift registers 8, 9, . . . and for the coefficient program 226 and the switch pulse generator for the switches 12, 13, . . .

The output signal which appears at the output terminal 40 of the apparatus described so far is the input signal which has been filtered in accordance with the transfer characteristics H ($\omega$) both the amplitude frequency characteristic and the phase frequency characteristic of which can be adjusted at will by a suitable choice of the pulse groups of the coefficient program 226.

The following explanation of the operation of the described apparatus starts with the occurrence of the pulse group $U_\nu$ at the parallel output of the analog-to-digital converter 3 at the clock instant $\nu T$, at which instant $\nu T$ the pulses of the pulse group $U_\nu$ are inserted via the switches 12 and 13 into the first shift register elements of the shift register 8, 9, and the pulses of the preceding pulse groups $U_{\nu\ -1}, U_{\nu\ -2}\ldots U_{\nu\ -(n+2)}$ are shifted to the next shift register elements of the shift registers 8, 9, the pulses of the pulse group $U_{\nu\ -(n-1)}$ being applied to the digital multiplier 16 for digital multiplication by the instantaneous pulse group $O_n$ of the coefficient program 226 which occurs at this instant. Thus there appears at the parallel output of the digital multiplier 16 the multiplication product in the form of a pulse group $O_n U_{\nu\ -(n+1)}$, which is applied to the accumulator 33.

In the interval between the next subsequent shift instant $\nu T + T/n$ and the subsequent clock instant $(\nu + 1)T$ the last shift register element of each shift register 8, 9, . . . . is connected via the switch 12, 13, respectively and the feedback circuit 10, 11 respectively to the first element of the relevant shift register, and in the successive shift periods the pulses of the pulse groups are cyclically shifted, the pulses in the last shift register element being shifted to the first shift register element, whilst simultaneously in the digital multiplier 16 the pulse groups formed by these pulses are digitally multiplied by the relevant pulse groups of the coefficient program 226. For example, at the shift instant $\nu T + T/n$ the pulses of the pulse group $U_{\nu\ -(n-2)}$ and at an arbitrary shift instant $\nu T + (n-q)T/n$ the pulses of the pulse group $U_{\nu\ -(q-1)}$ are shifted to the first shift register elements of the shift registers 8, 9, . . . these pulse groups being multiplied in the digital multiplier 16 by the pulse groups $C_{n-1}$ and $C_q$ respectively of the coefficient program 226. After n shift instants the next clock instant $(\nu - 1)T$ is reached and the pulses of the pulse group $U_{\nu\ -1}$ which then appears at the parallel output of the analog-to-digital converter 3 are applied via the switches 12, 13, to the first shift register elements of the shift registers 8, 9 respectively, after which the described cycle will be repeated.

During the clock period digital summation in the accumulator 33 of the multiplication products in the form of pulse groups $C_n U_{\nu\ -(n-1)}, C_{n-1} U_{\nu\ -(n-2)} \ldots C_q U_{\nu\ -(q-1)} \ldots C_1 U$ produced in the digital multiplier yields the pulse group:

$$\sum_{q=n}^{q=1} C_q U_{\nu\ -(q-1)}$$

from which by substitution of the formulae for $C_q$ and $U_{\nu\ -(q-1)}$ given hereinbefore the number characterized by this pulse group if found in sign and magnitude. At the end of each clock period these pulse group are applied to the digital-to-analog converter 37 and the accumulator 33 is reset to the rest condition by the reset pulses, so that as a result of digital-to-analog conversion in the digital-to-analog converter 37 and sampling in the sampling device 38 there is produced via the low-pass filter 39 at the output terminal 40 the output signal from the apparatus which, as was mentioned above, forms the output signal filtered in accordance with the transfer function $H(\omega)$.

In order to find the transfer function $H(\omega)$ we may start from the pulse response $I(t)$ which is determined by the output signal of the apparatus described when a single pulse of unit value is applied to it. If for example a single pulse causes the appearance of a pulse group $U_\nu$ at the output terminals 4, 5, 6, . . . of the analog-to-digital converter 3 at the clock instant $\nu T$, which means that all the pulse groups preceding and succeeding the pulse group $U_\nu$ are equal to zero, the pulse group $U_\nu$ will cause the pulse groups $C_1 U_\nu, C_2 U_\nu \ldots C_q U_\nu \ldots C_n U_\nu$ respectively to be produced as multiplication products at the parallel output of the accumulator 33 at the end of each of the clock intervals succeeding the clock instants $\nu T, (\nu +1)T, \ldots (\nu +q-1)T \ldots (\nu + n-1)T$.

Thus there will appear at the output of the digital-analogue converter 37 a sequence of output pulses having numerical values which are characterized by the pulse groups $C_1 U_\nu, C_2 U_\nu \ldots C_q U_\nu \ldots C_n U_\nu$, whilst standardisation of the pulse group $U_\nu$ to the unit value yields the pulse response $I(t)$ of the apparatus.

By way of illustration FIG. 2a is a time diagram showing the pulse response $I(t)$ in which the successively appearing pulses in terms of sign and magnitude are nothing but numerical values characterized by pulse groups $C_1 C_2 \ldots C_q \ldots C_n$ of the coefficient program 226, which numerical values have been given above in the form of formulae.

To find the transfer function $H(\omega)$ from the pulse response $I(t)$ we start from an arbitrary component having an angular frequency $\omega$ and an amplitude E in the frequency spectrum of the signal applied to the input of the apparatus, which component in complex form can be written: $E e^{j\omega t}$.

At the output of the digital-to-analog converter 37 the relevant spectrum component occurs in the successive output pulses, shifted through time intervals $T, 2T, 3T \ldots qT \ldots nT$ and with an amplitude equal to the initial amplitude multiplied by the numerical values $C_1, C_2 \ldots C_q \ldots C_n$ respectively of the coefficient program 226, that is to say the arbitrary component $E e^{j\omega t}$ of the frequency spectrum of the input signal produces an output signal:

$$E \sum_{q=1}^{q=n} C_q e^{j\omega (t-qT)}$$

at the output of the apparatus, so that the transmission characteristic $H(\omega)$ is $$H(\omega) = \sum_{q=1}^{q=n} C_q e^{-j\omega qT}$$

Actually, the transfer characteristic $H(\omega)$ is nothing but the transform of the pulse response $I(t)$ to the frequency plane, and conversely the pulse response $I(t)$ is nothing but the transform of the transfer characteristic $H(\omega)$ to the time plane. By way of example, in the frequency diagram of FIG. 2b the curve $A(\omega)$ represents the amplitude-frequency characteristic associated with the pulse response $I(t)$ of FIG. 2a and the curve $B(\omega)$ represents the phase-frequency characteristic which in this case is linear.

Hence if a given transfer characteristic $H(\omega)$ is desired which is characterized by the associated amplitude-frequency characteristic A(ω) and phase-frequency characteristic B(ω), by means of Fourier analysis the pulse response I(t) and from this the pulse groups C of the coefficient program can be calculated in known manner, so that the apparatus described is completely defined.

It was found that for certain uses, for example, when transfer characteristics of the type illustrated in FIG. 2b are to be achieved, in apparatus of the abovedescribed type difficulties of fundamental nature arise, particularly in designing the digital multiplier 16, as will now be set forth with reference to the technical data of such apparatus. In a practical embodiment of the apparatus an analog-to-digital converter 3 was used which had eight output terminals each connected to a shift register comprising 64 shift register elements for handling the pulse groups from the analog-to-digital converter 3 which each comprised eight pulses and appeared in accordance with a clock frequency of 40 kHz. A coefficient program 226 was used which comprised 12 shift registers each having 65 shift register elements for producing pulse groups of 12 pulses each; in the digital multiplier 16 the pulse groups of eight and 12 pulses derived from the analog-to-digital converter 3 and from the coefficient program 226 respectively have to be digitally multiplied within one shift period, which in this device was a 1/65 part of a clock period of 25 μs, that is 0.384 μs.

The complexity of the digital multiplier 16 increases progressively with the numbers of pulses which constitute the said pulse groups; for example, in a practical embodiment of the digital amplifier 84 digital summing devices were used, the available internal processing time being only 0.022 μs; such a device can hardly be manufactured in a single semiconductor body.

On the basis of a different concept, matching of the shape of the required transfer characteristic and of the digital processing problems enables the restrictions the field of use of the known apparatus to be avoided and a considerable simplification to be obtained by the apparatus according to the invention as shown in FIG. 3, in which elements corresponding to those of FIG. 1 are designated by the same reference numerals.

According to the invention this was achieved in that the digital multiplier 16 is in the form of a pulse switch having a plurality of pulse switch positions for discrete multiplication of the pulses derived from the shift registers 8, 9 . . . by discrete multiplication coefficients which in a differential code characterize the transfer characteristic to be obtained, whilst the digital multiplier in the form of a pulse switch is further provided with a pulse switch setting circuit which is controlled by a setting code produced by a setting program 26 for setting the pulse switch to a given one of the various pulse switch positions in each of which the discrete digital multiplication is performed by one of the said plurality of multiplication coefficients in a differential code which exclusively form part of the discrete set of numbers $2^m$, where $m = 0, 1, 2 \ldots$ and possibly the number 0, whilst in the circuit which includes the storage device 33 the multiplication products applied are continuously summed with the multiplication products of the preceding time periods.

In the embodiment shown a pulse switch 16 of the parallel type is used which is assumed for the sake of simplicity to have only three positions which correspond to the discrete digital multiplication coefficients $2^1$, $2^0$, and 0 respectively. The pulse switch comprises parallel connected pulse switch channels 56, 57; 58, 59 connected between the input terminals 17, 18 of the digital multiplier 16, which are connected to the output circuits of the shift registers 8, 9 and the input terminals 34, 35, 36 of the storage device 33, the parallel connected pulse switch channels 56, 57; 58, 59 each connected an input terminal 17, 18 respectively of the pulse switch 16 to the input terminal 34 or 35 of corresponding numerical value and to the next input terminal 35 or 36 respectively of the storage device 33. For example, the input terminal 17 of the pulse switch 16, which terminal corresponds to the number $2^0$, is connected to the input terminals 34, 35 of the storage device 33, which correspond to the numbers $2^0$ and $2^1$ respectively; the input terminal 18 of the digital amplifier 16, which terminal corresponds to the number $2^1$, is connected to the input terminals 35, 36 which correspond to the numbers $2^1$ and $2^2$ respectively, and so on.

The Figure only shows the pulse switch channels 56, 57 and 58, 59 which are connected to the output circuits of the shift registers 8 and 9 respectively, because the pulse switch channels connected to the remaining shift registers are of similar construction. In particular, for performing the discrete digital multiplication by the desired digital multiplication coefficient, the pulse switch setting circuit controlled by the setting code of the setting program 26 is in the form of a selecting gate device comprising pairs of NOT-AND gates 60, 61 and 62, 63 included in the pulse switch channels 56, 57 and 58, 59 respectively. For sign setting, the pulse switch channels 56; 57, 58; 59 . . . connected to the input terminals 34, 35, 36 respectively of the storage device 33 include sign stages 64, 65, 66 respectively which each comprise two parallel connected branches, each branch including selection gates which are controlled by relatively logically inverted sign pulses from the setting program 26 and are in the form of NOT-AND gates 69, 70; 71, 72; 73, 74 respectively, the NOT-AND gates 70, 72, 74 each being connected in cascade with a NOT-AND gate 75, 76, 77 respectively which serves as an inverter. In order to obtain from the logically inverting pulse group appearing at the outputs of the sign stages 64, 65, 66 the pulse group of opposite sign in a binary number system, an additional pulse corresponding to the value $2^0$ is to be added to the logically inverted pulse group in the storage device 33, and in the embodiment shown this is effected in that sign pulses derived from the setting program 26 are applied through a line 79 to an input terminal 34' of the digital summing device 41 in the storage device 33. To ensure relative equality of the digital circuits situated between the input terminals 17, 18 and the output terminals 30, 31 of the pulse switch 16 there is connected to the sign stage 64 of the first pulse switch channel an additional NOT-AND gate 67 which otherwise is not of importance because it is connected via a line 68 to a fixed potential corresponding to "0" pulses.

In the apparatus described the NOT-AND gates 67, 61, 63 and 60, 62 of the setting circuit of the pulse switch channels 58 to 59 are controlled via input terminals 19 and 20 respectively of the pulse switch 16 by pulses derived from putput terminals 23, 24 respectively of the setting program 26, and NOT-AND gates 70, 72, 74 and 69, 71, 73 of the sign stages are controlled via input terminals 21 and 22 respectively by relatively logically inverted sign pulses derived from output terminals 25 and 25' respectively of the setting program 26. Similarly to the coefficient program 226 of the known apparatus shown in FIG. 1 the setting program 26 is in the form of a read program comprising three circulating shift registers 27, 28 and 29 each having n shift register elements, but otherwise it is essentially different from the coefficient program 226 of the known apparatus, since the setting program 26 provides a setting code for setting the pulse switch 16 and hence does not necessarily provide multiplication coefficients according to a binary system in the form of pulse groups as does the coefficient program 226.

Depending upon the setting code at the output terminals 23, 24 of the setting program 26, control of the NOT-AND gates 60, 61, 62, 63 causes the pulse switch channels 56, 57, 58, 59 respectively to be set to the desired discrete multiplication coefficients, which in the embodiment shown are 0, $2^0$, $2^1$ respectively, whilst at the same time the desired sign setting is effected by means of the relatively logically inverted sign pulses from the output terminals 25, 25' of the setting program 26 by control of the NOT-AND gates 69, 70, 71, 72, 73, 74 of the sign stages 64, 65, 66 in conjunction with the sign pulses applied via a line 79.

In particular, when at the output terminals 23, 24 of the setting program 26 the pulse group 00 appears, none of the pulse switch channels 56, 57, 58, 59 is rendered operative; when the pulse group 01 appears the pulse switch channel 56, 58 will be rendered operative, and when the pulse group 10 appears the pulse switch channel 57, 59 will be rendered operative, whilst depending upon whether the sign pulses at the output terminals 25, 25' of the setting program 26 characterize a positive or a negative sign the pulses from the pulse switch channels 56, 57; 58, 59 are applied with the desired sign to the relevant input terminal 34, 35, 36 either via one branch or via the other branch of the sign stage 64, 65, 66 respectively. If for example at a given instant the pulse group U$\nu$ appears at the input terminals 17, 18 of the pulse switch 16 and simultaneously the pulse group 00 appears at the output terminals 23, 24 of the setting program 26, none of the pulses of the pulse group U$_\nu$ will reach the input terminal 34, 35, 36 of the storage device 33, which corresponds to the numerical value O.U$_\nu$; if simultaneously the pulse group 01 appears at a output terminals 23, 24, the pulses of the pulse group U$_\nu$ will reach the input terminal 34, 35 of the storage device via pulse switch channels 56, 58 after having been provided with the desired sign in the sign stages 64, 65 respectively, which corresponds to the numerical value $\pm 2^0$. U$_\nu$, and if the pulse group 10 appears at the output terminals 23, 24 the pulses of the pulse group U$_\nu$ will reach the input terminals 35, 36 via pulse switch channels 57, 59 including the sign stages 65, 66 respectively, which corresponds to the numerical value $\pm 2^1$. U$_\nu$. Thus the pulses of the pulse groups which appear at the output circuits of the shift registers 8, 9 are directly, without digital summation being performed, applied to the input terminals 34, 35, 36 of the storage device 33 after discrete digital multiplication and plurality setting in the pulse switch channels 56, 57; 58, 59.

The apparatus according to the invention not only differs from the known apparatus in the use of the pulse switch 16 for discrete digital multiplication but also in that the digital multiplication is performed by multiplication coefficients which characterize the transfer characteristic in a differential code and moreover in that in the circuit which includes the storage device 33 the multiplication products derived from the pulse switch 16 and the multiplication products produced in the preceding periods are continuously summed. In particular this continuous summation is performed by providing the storage device 33 with an integrator, which may be effected in various manners, for example in the embodiment shown, for a clear understanding of the invention, the digital integrating element 78 is in the form of an up-down counter succeeding the accumulator 33.

Owing to the essential difference in concept, in the apparatus according to the invention the pulse response is obtained in a manner different from that used in the known apparatus and illustrated in FIG. 2a, as will now be described in more detail with reference to FIG. 2c.

Instead of representing the pulse response shown in FIG. 2a at the clock instant with respect to magnitude and sign by the multiplication coefficient $C_1, C_2 \ldots C_q, \ldots C_n$, as is the case in the known apparatus, in the apparatus according to the invention in the pulse response characteristic of FIG. 2c the multiplication coefficients each represents the difference from the pulse response value reached at the preceding clock instant by a value taken from the exponential number sequence $2^m$, to which may be added the number 0, the differential values given by the multiplication coefficients having values from the discrete number sequence $2^m$ and possibly the number 0 which vary in accordance with the steepness of the pulse response. Thus the shape of the pulse response characteristic I($t$) and hence that of the transfer characteristic H($\omega$) are not directly characterized by the multiplication coefficients $C_1, C_2 \ldots C_q \ldots C_n$ in a direct code, as is the case in the known apparatus, but they are characterized by the differential code according to the discrete number sequence $2^m$ and possibly the number 0, the continuous summation or integration of the instantaneous multiplication coefficients with the multiplication coefficients of the preceding periods by means of the integrating network used yielding the pulse response characteristic I($t$) and hence the transfer characteristic H($\omega$). The shape of the pulse response characteristic I($t$) composed in this manner and shown in FIG. 2c has been made equal to that of the pulse response characteristic of the known apparatus as shown in FIG. 2a so that the transfer characteristics H($\omega$) also are equal and have the form shown in FIG. 2b.

It was found unexpectedly that when using the combination of steps according to the invention not only just the multiplication coefficient according to the exponential number sequence $2^m$ and, if required, the number 0 when used for the differential composition of the pulse response characteristic are of particular advantage for accurately shaping the relevant pulse response I($t$) and hence the transfer characteristic H($\omega$), but also that exactly the use of this sequence of discrete multiplication coefficients which is matched to the transfer characteristic provides considerably simplification of operation and a maximum increase of the available internal processing time. The two effects jointly result in a considerable extension of the field of use, for example an increase in the set of transfer characteristics to be realized in practice, the use of integrated circuit technology and the like.

The obtained important technical progress will now be illustrated with reference to the most important data of the above-described apparatus. The apparatus includes 8 shift registers which each comprise 64 shift register elements for handling pulse groups from the analog-to-digital converter 3 which appear in accordance with the clock frequency of 40 kHz, and a setting program 26 is used which includes 3 shift registers which each comprise 65 register elements, 2 pulse switch channels being connected to the output circuit of each shift register. Compared with the known device shown in FIG. 1 for realizing the same transfer characteristic H($\omega$) the device shown in FIG. 3 is remarkably simplified in particular with respect to the design of the setting program 26 as a result of the reduction of the number of shift registers and to the considerable simplification of the digital amplifier 16 in the form of the pulse switch, inter alia owing to the absence of digital summation devices, so that the available internal processing type can be optimised.

The device according to the invention is distinguished not only by the above advantages but also by its flexibility which consists in that different transfer characteristics are obtainable by merely exchanging the setting program 26 and in that there is complete freedom in choosing the type of the analog-to-digital converter 3, for example the pulse group coder 3 shown in FIG. 3 may be replaced by a delta modulator, as will now be described more fully with reference to FIG. 4.

In the apparatus according to the invention shown in FIG. 4 the analog signals situated in the band of 300 to 3,400 Hz which are received through the line 1 are applied for analog-to-digital conversion to a delta modulator 81 which through a line 82 is controlled by pulses of frequency 56 kHz produced by the central control pulse generator 54. Elements which correspond to those of FIG. 1 are designated by like reference numerals.

The filtering process is effected in the same manner as described with reference to FIG. 3; in particular, the output pulses from the delta modulator 81 are applied via the circulating shift register 8 and pulse switch channels 56, 57 to a storage device in the form of a digital integrator 83 having a parallel input comprising input terminals 34, 35 and a parallel output comprising output terminals 84, 85 86, . . . . , the input terminals 34, 35 and the output terminals 81, 85, 86, . . . corresponding to the numbers $2^0$, $2^1$ . . . . respectively. The pulse switch channels 55, 56 are similar to the pulse switch channels of FIG. 3, and control of the pulse switch channels 36, 37 by the setting code of the setting program 26 also is effected in the manner described with reference to said Figure, whilst the digital integrator 83 is of a structure similar so that of the accumulator of FIG. 3, however, in the integrator the bistable triggers 47, 48, 49 are not reset to the rest condition by reset pulses from the central control pulse generator 34. If desired, the digital integrator 83 may be provided with a digital leakage circuit.

Thus from the output terminals of the digital integrator 83 pulse groups according to a binary number system are derived which possibly may be used for further digital processing. If the output signal is required to be the filtered incoming signal in analog form, the output signal from the digital integrator 83 is applied, as is shown in the Figure, via a digital-to-analog converter 37 to a sampling device 36 which is succeeded by a delta demodulator 88 and a simple low-pass filter 39. Thus the filtered analog output signal of the device appears at the output terminals 40.

In addition to the embodiments shown by way of example in the Figures described so far, within the scope of the invention further embodiments are possible, for example, the switching program 26 may be a read-only store of a different type, for example a magnetic core store, a transistor matrix or the like, and the order of the integrator and the digital-to-analog converter may be reversed, in which event an integrator designed according to analog techniques must be used. Furthermore it is not absolutely necessary to use circulating shift registers, as will now be set out with reference to the embodiment shown in FIG. 5.

In the apparatus shown in FIG. 5 the signals to be transmitted are derived in the form of synchronous pulse signals, for example synchronous telegraphy signals, from a pulse source 89, the square-wave pulse signals appearing at the output terminal 40 after having passed through the filter shown in which they are given a bandwidth suitable for further processing. The synchronous pulse signals are controlled by clock pulses from the central control pulse generator 54 via a line 90.

For the filtering process the pulse signals from the pulse source 89 are applied, in a manner similar to that described with reference to FIGS. 3 and 4, to a shift register 91 comprising shift register elements 92, 93, 94, 95 the contents of which are shifted in accordance with the clock frequency or a multiple thereof by means of a line 96, whilst also in a manner similar to that used in the devices of FIGS. 3 and 4 it is ensured that for discrete digital multiplication each input pulse of the shift register 91 produces a plurality of output pulses. For this purpose in the apparatus shown instead of a circulating shift register an electronic switch 97 is used which in each shift period of the shift register 91 scans the terminals of the shift register elements 98 to 102 under the control of switch pulses which are applied by the central control pulse generator 34 via a line 103 and also form the control pulses for the setting program 26.

Similarly to what has been described hereinbefore, by means of pulse switches forming part of the device the pulses from the switch 97 are digitally multiplied by the discrete multiplication coefficient $2^m$ and if required by the number 0 which in differential code characterized the transfer characteristic to be realized, so that after integration in the digital integrator 83 and digital-to-analog conversion in the digital-to-analog converter 37 the output signal is obtained at the output terminal 40.

The structure of the pulse switch 16 is similar to that used in the apparatus shown in FIGS. 3 and 4, however, instead of two pulse switch channels three pulse switch channels 104, 105, 106 are used which comprise NOT-AND gates 107, 108, 109 respectively and sign stages 110, 111, 112 respectively which include NOT-AND gates 113 to 118 which are controlled by sign pulses taken from the terminals 25 25' of the setting program 26, and NOT-AND gates 119, 120, 121 respectively which act as inverters.

In this apparatus a discrete multiplication by the multiplication coefficients 0, $2^0$, $2^1$ and $2^3$ is performed by using the three pulse switch channels 104, 105, 106 under control of the pulse group code supplied by the setting program 26 which by way of output terminals 122, 123, 124 is applied to input terminals 125, 126, 127 respectively of the pulse switch 16.

More particularly, the appearance at the output terminals 122, 123, 124 of pulse groups 000, 001, 010, 100 respectively will result in discrete multiplications by multiplication coefficients of 0, $2^0$, $2^1$, $2^3$ respectively.

In its operation the apparatus shown in FIG. 5 is identical to the devices described with reference to FIGS. 3 and 4, so that the device of FIG. 5 need not be described more fully. In itself the use of an additional pulse switch channel for digital multiplication by an additional number within the discrete set of numbers $2^m$ results in a reduction of the number of shift register elements 92 to 95 of the shift register 91, which reduction may be considerable if the said additional multiplication coefficient is suitably chosen.

In the pulse switch channels the NOT-AND gates may be replaced by selection gates of a different type, for example AND gates.

Whereas hereinbefore pulse switches of the parallel type have been described, the apparatus shown in FIG. 6 and 7 are provided with pulse switches of the series type.

In the apparatus shown in FIG. 6 the incoming analog signals from the line 1 again are applied to a sampling device 2 the output of which is connected to an analog-to-digital convertor 3 in the form of a pulse group coder having a series output. Thus at the output of the pulse group coder 3 pulse groups are obtained which are constituted by component pulses which succeed one another in time, corresponding component pulses of successive pulse groups appearing in accordance with the clock frequency whilst the component pulses of a pulse group which succeed one another in time characterize successive numbers in a binary number system; in particular the first component pulse corresponds to the number $2^0$, the second to the number $2^1$ and so on. The time spacing between two successive pulse groups is equal to 4 times the spacing $\tau$ of two successive pulses in a pulse group.

For the purpose of digital filtering the pulse groups produced in the pulse group coder 3 are applied to a circulating shift register 8 which is provided with a feedback circuit 10 and with an electronic switch 12 by means of which each pulse group applied to the input circuit of the shift register 8 causes a sequence of successive pulse groups to be produced which are applied to a digital multiplier 17 succeeded by a storage device 83. After decoding in a digital-to-analog converter 37 in the form of a pulse group coder having a series output and after sampling in a sampling device 38, the output signal of the apparatus is taken via a sample low-pass filter 39 from the output terminal 40.

According to the invention the discrete digital multiplier 16 is in the form of a pulse switch which in the embodiment shown is provided with a plurality of parallel-connected pulse switch channels 128 to 132 and with a pulse switch setting circuit which comprises an electronic switch 174 which is controlled by the setting code of the setting program 26 and has contact terminals 133 to 137 connected to the pulse switch channels 128 and 132, whilst for sign setting the electronic switch 174 is connected to a sign stage 138 while comprises two parallel branches, one of which includes a NOT-AND gate 139 which acts as an inverter, and a sign setting circuit provided with an electronic switch 140 which is controlled by sign pulses of the setting program 26 and has contact terminals 141 and 142 each provided on one of the parallel branches. Similarly to the embodiments shown in FIGS. 3 to 5, the pulse groups derived as multiplication products from the pulse switch 16 are integrated in the succeeding storage device 83, which in this embodiment is in the form of a digital integrator having a series output and comprising a digital summing device 143, a first feedback loop 144 and a second feedback loop 145, the first feedback loop 144 including a shift register 146 which for integration of successive pulse groups has a delay time equal to a clock period T, whilst the loop 145 includes a shift register 147 which for delaying the carry pulses produced during the digital summation has a delay time equal to the time spacing $\tau$ of two successive component pulses in a pulse group.

Similarly to the apparatus shown in FIGS. 3 to 5, in this apparatus in order to obtain a pulse group of opposite sign in a binary number system there is added to the logically inverted pulse group from the polarity stage 138 a pulse which corresponds to the value $2^0$, which just as in the abovedescribed embodiments is in the form of a sign pulse derived from the setting program 26 via a line 79. For this purpose, in the embodiment shown this sign pulse from the line 79 is applied to an input terminal 175 of the integrator 180 via an electronic switch 177 which is controlled by switching pulses from a line 176 and during the first component pulse of the pulse group is connected to the line 79 and during the time up to the appearance of the first component pulse of the next pulse group is connected to the feedback loop 145.

The integrated pulse groups are derived from the output terminal 148 of the digital integrator 83 and are applied for further processing to the digital-to-analog converter 37 having a series input.

For discrete digital multiplication in the pulse switch 16 of the series type shown a pulse switch channel 128 is at a fixed potential which corresponds to 0 pulses and hence to ao multiplication coefficient 0, whilst the remaining pulse switch channels 129 to 132 are connected to the output of the circulating shift register directly and by way of delay elements in the form of shift registers 150, 151, 152 respectively, which elements have delay times equal to once, twice and four times the spacing $\tau$ between two successive component pulses in a pulse group, thus corresponding to discrete multiplication coefficients $2^0$, $2^1$, $2^2$ and $2^4$ respectively, since a time delay m $\tau$ of a pulse group results in digital multiplication of this pulse group by a discrete multiplication coefficient which exclusively forms part of the discrete number set $2^m$, where $m = 0, 1, 2..$ Just as in the above described apparatus all the control pulses are derived from the control pulse device 54 connected to the central pulse generator 55, namely the sampling pulses for the sampling devices 2 and 38, the control pulses for the analog-to-digital converter 3 and for the digital-to-analog converter 37, the shift pulses for the various shift registers 8, 146, 147, 150, 151, 152 and the setting program 26 and the switch pulses for the electronic switches 12 and 177.

Each time in the pulse switch 16 the electronic switches 174, 140 are moved into the desired positions under the control of the setting code of the setting program 26, digital multiplication is performed by the discrete multiplication coefficients 0, $2^0$, $2^1$, $2^2$ or $2^4$ and sign setting of the pulse groups of the circulating shift register 8 takes place, whilst after the pulse groups derived from the pulse switch 16 have been integrated in the digital integrator 83, digital filtering has been effected. In the same manner as has been explained with reference to the time diagram of FIG. 2c suitable setting of the discrete multiplication coefficients and of the sign by means of the setting code of the setting program 26 enables the pulse response curve I(t) to be built up which is characteristic of the desired transfer characteristic H(ω).

FIG. 7 shows a modified embodiment of the device shown in FIG. 6 which is provided with a pulse switch 16 of the series type, elements corresponding to those of FIG. 6 being designated by like reference numerals.

In the embodiment shown a pulse switch 16 having three pulse switch channels 153, 154, 155 is used and the pulse switch setting circuit is formed by gate devices which are included in the pulse switch channels and take the form of NOT-AND gates which by way of input terminals 156, 147 of the pulse switch 16 are connected to output terminals 158, 159 of the setting program 26, whilst the pulse switch channels 153, 154, 155 also include sign stages 110, 111, 112 the design and control of which are equal to those of the sign stages of the devices shown in FIGS. 3 to 5. The reference numerals of the elements of the sign stages 110, 111, 112 correspond to those of their couterparts in FIG. 3.

Just as in the device shown in FIG. 6, discrete digital multiplication of the pulse groups is performed by means of the various pulse switch channels 153, 154, 155 which under the control of the setting code appearing at the output terminals 158, 159 of the setting program 26 may or may not be rendered operative; at the setting code OO none of the pulse switch channels will be operative whilse the setting codes 0, 1, 10, 11 will render operative the pulse switch channels 153, 154, 155 respectively. For this purpose the gate devices in the pulse switch channels 153, 154, 155 are provided with NOT-AND gates 160, 161, 162 respectively, the inputs of which are suitably connected, directly and through NOT-AND gates 163, 164, which act as inverters, to the output terminals 158, 159 of the setting program 26 and the outputs of which are connected, via NOT-AND gates 165, 166, 167 which act as inverters, to NOT-AND gates 168, 169, 170 respectively. The NOT-AND gates 168, 169, 170 are also connected by lines 171, 172, 173 respectively to different points of the circulating shift register 8 so as to have relative differences in delay time which are equal to integral multiples of the time spacing $\tau$ of two successive component pulses in a pulse group. For example, in the embodiment shown the difference in delay time between the line 171 and the line 172 is $\tau$ and that between the line 171 and the line 173 is $3\tau$, and when the delay in the line 171 is assumed to be O, in complete accordance with the device shown in FIG. 6 operation of the pulse switch channels 153, 154, 155 in this order results in digital multiplication by the discrete multiplication coefficients $2^0$, $2^1$ and $2^3$ respectively. Thus whilst using only two output terminals 158, 159 of the setting program 26, in the embodiment shown in digital multiplication by one of four discrete multiplication coefficients is performed, more particularly by the discrete multiplication coefficient 0, $2^0$, $2^1$ and $2^3$ at the setting codes 0, 01, 10, 11 respectively, the use of the elements of the circulating shift register 8 introducing the desired delay times in the pulse switch channels 153, 154, 155 for the said discrete multiplication coefficients without the need for additional shift registers as used in the device shown in FIG. 6.

The operation of the device of FIG. 7 is equal to that of the device of FIG. 6, the filtered output signal being derived via the sampling device 38 and the low-pass filter 39 from the output terminal 40 after discrete digital multiplication and sign setting of the pulse groups of the circulating shift register 8 in the pulse switch 16 and subsequent integration in the integrator 83 and digital-to-analog conversion in the digital-to-analog converter 37.

In the above the apparatus according to the invention has been illustrated with reference to various embodiments, difficulties which may arise in the digital processing apparatus being obviated in principle by mutual matching of the transfer characteristic to be realized and the digital processing, with the result that, as set forth and illustrated above, considerable simplification of structure is combined with extended possibilities of application.

What is claimed is:

1. An apparatus for producing a predetermined transfer characteristic of information-containing signals, comprising clock means for generating a clock pulse, input means for supplying digital representations of said information-containing signals; coefficient generator means for supplying a first train of pulses of digital multiplication coefficients; delay means, connected to said input means, for supplying a second train of pulses of representations of said information-containing signals in successive time periods; digital multiplier means, having a first input connected to said coefficient generator, and a second input connected to said delay means and an output, and comprising modifying means having a plurality of settings corresponding to said multiplication coefficients characterizing said predetermined transfer characteristic of said signals; and output means connected to said output of said digital multiplier for summing the output signals appearing at said output.

2. Apparatus as defined in claim 1, wherein said output means includes a storage device for storing said output signals.

3. Apparatus as defined in claim 1, wherein said modifying means is a pulse switch, including a switch setting circuit control led by a setting code for setting said switch to predetermined position corresponding to one of said settings.

4. Apparatus as claimed in claim 3 wherein the pulse switch is also provided with a sign stage which is controlled by sign pulses from the setting program and simultaneously with the discrete digital multiplication in the pulse switch effects the sign setting.

5. Apparatus as claimed in claim 4, wherein the sign stage has two parallel branches, one of which includes an inverter, and a sign setting circuit which is controlled by the sign pulses from the setting program.

6. Apparatus as claimed in claim 5, wherein the sign setting circuit is in the form of two gates which each are included in one of the parallel branches and are controlled by relatively logically inverted sign pulses from the setting program.

7. Apparatus as claimed in claim 5, wherein the sign setting circuit is an electronic switch which has contact terminals to both parallel branches and is controlled by the sign pulses from the setting program.

8. Apparatus as claimed in claim 4 wherein there is added to the pulses derived from the sign stage a sign pulse from the setting program, which pulse corresponds to the numerical value $2^0$.

9. Apparatus as defined in claim 1, wherein said digital multiplication coefficients are selected from the discrete set $(0, 2^m)$, wherein $m = 0, 1, 2, \ldots N$.

10. Apparatus as defined in claim 1, wherein said output means comprises an integrator for continuously summing said output signals.

11. Apparatus as defined in claim 3, wherein said pulse switch includes a plurality of pulse switch channels corresponding to said pulse switch positions, said channels being rendered operative under the control of said pulse switch setting circuit.

12. Apparatus as claimed in claim 11, wherein the pulse switch circuit comprises an electronic switch which has contact terminals provided on the pulse switch channels and is controlled by the setting code of the setting program.

13. Apparatus as claimed in claim 11, provided with a parallel input storage device, wherein an input of the pulse switch connected to the delay device is connected by way of a plurality of pulse switch channels to different input terminals of the parallel input of the storage device which each correspond to one of the multiplication coefficients of the discrete number set $2^m$.

14. Apparatus as claimed in claim 11, for processing code groups composed of component pulses which succeed one another with time spacings $\tau$, which device is provided with a series-input storage device, wherein the series input of the storage device is connected to at least two pulse switch channels, at least one of the channels including a delay element which causes a difference in delay time equal to an integral multiple of the time spacing $\tau$ between two successive component pulses of a pulse group.

15. Apparatus as claimed in claim 14, wherein the pulse switch channels are connected to different points of the delay device to which the information pulses are supplied.

16. Apparatus as defined in claim 11, wherein said pulse switch channel includes a selection gate device to which are applied both said second train of information pulses derived from said delay means and said first train of pulses derived from said setting code.

17. Apparatus as claimed in claim 16, wherein the selection gate device includes a gate to one input of which are applied information pulses from the delay device and to the other input of which are applied pulses derived from the setting code of the setting program.

18. Apparatus as claimed in claim 17, wherein the gate in the selection gate device to which are applied informatin pulses from the delay device and pulses derived from the setting code of the setting program is connected to an output terminal of the setting program.

19. Apparatus as claimed in claim 17, wherein the gate in the selection gate device to which are applied information pulses from the delay device and pulses derived from the setting code of the setting program is connected via at least one gate to a plurality of output terminals of the setting program.

* * * * *

UNITED STATES PATENT AND TRADEMARK OFFICE
CERTIFICATE OF CORRECTION

PATENT NO. : 3,965,338

DATED : June 22, 1976

INVENTOR(S) : PETRUS JOSEPHUS VAN GERWEN ET AL

It is certified that error appears in the above-identified patent and that said Letters Patent are hereby corrected as shown below:

Column 2, line 47, "these" should be --those--

Column 3, line 58, "n_1,p_2" should be --$c_{n-1,p-2}$-- line 58, "$c_{n-1}$" should be --$\bar{c}_{n-1}$--

Column 5, line 13, "$0_n$" should be --$C_n$-- line 16, "$0_n U_{\nu-(n+1)}$" should be --$C_n U_{\nu-(n-1)}$-- line 38, "$(\nu - 1)T$" should be --$(\nu + 1)T$-- line 39, "$U_{\nu-1}$" should be --$U_{\nu+1}$-- line 57, "group" should be --groups--

Column 6, line 39, "$C_9$" should be --$C_q$--

Column 9, line 44, "a" should be --the--

Column 11, line 47, "55, 56" should be --57, 56-- line 49, "36, 37" should be --56, 57-- line 55, "34" should be --54-- line 65, "36" should be --38--

Column 12, line 39, "34" should be --54--

UNITED STATES PATENT AND TRADEMARK OFFICE
CERTIFICATE OF CORRECTION

PATENT NO.  : 3,965,338
DATED       : June 22, 1976
INVENTOR(S) : PETRUS JOSEPHUS VAN GERWEN ET AL It is certified that error appears in the above—identified patent and that said Letters Patent are hereby corrected as shown below:

```
Column 13, line 47, "17" should be --16--
           line 51, "sample" should be --simple--
Column 15, line 25, "FIG. 3" should be --FIG. 5--
           line 59, "in" (second occurrence) should be --a--

Claim  3, line 3, "control led" should be --controlled--
Claim 18, line 3, "informatin" should be --information--
```

Signed and Sealed this

Tenth Day of May 1977

[SEAL]

Attest:

RUTH C. MASON
*Attesting Officer*

C. MARSHALL DANN
*Commissioner of Patents and Trademarks*